United States Patent
Nyström

(10) Patent No.: US 12,044,749 B2
(45) Date of Patent: Jul. 23, 2024

(54) ELECTRIC INSULATION MONITORING ARRANGEMENT

(71) Applicant: VOLVO TRUCK CORPORATION, Gothenburg (SE)

(72) Inventor: Mats Nyström, Torslanda (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 153 days.

(21) Appl. No.: 17/929,392

(22) Filed: Sep. 2, 2022

(65) Prior Publication Data
US 2023/0073233 A1    Mar. 9, 2023

(30) Foreign Application Priority Data

Sep. 6, 2021 (EP) .................................... 21195123

(51) Int. Cl.
*G01R 31/52* (2020.01)
*B60L 50/60* (2019.01)

(52) U.S. Cl.
CPC ............. *G01R 31/52* (2020.01); *B60L 50/66* (2019.02); *B60L 2200/18* (2013.01)

(58) Field of Classification Search
CPC .... G01R 31/52; G01R 31/007; G01R 31/006; B60L 50/66; B60L 2200/18
USPC ........................................................ 324/509
See application file for complete search history.

(56) References Cited

U.S. PATENT DOCUMENTS

| 2008/0278174 A1 | 11/2008 | Li et al. |
| 2018/0074108 A1 | 3/2018 | Dulle et al. |
| 2019/0162773 A1* | 5/2019 | Chou ................. H02M 5/458 |

FOREIGN PATENT DOCUMENTS

| DE | 102020109145 A1 | 12/2020 |
| EP | 3258280 A1 | 12/2017 |

OTHER PUBLICATIONS

Extended European Search Report in corresponding European Application No. 21195123.1 dated Feb. 25, 2022 (5 pages).

* cited by examiner

*Primary Examiner* — Farhana A Hoque
(74) *Attorney, Agent, or Firm* — Venable LLP; Jeffri A. Kaminski

(57) ABSTRACT

A method for determining whether an electric insulation of a conductor is sufficient, comprising switching on or off a resistive load between the conductor and ground, measuring a first voltage value $u_1$ of a resulting voltage $U_m$ between the conductor and ground at a first point in time $t_1$ after switching on or off the load, determining if the first voltage value $u_1$ fulfils a first condition, and/or determining an initial rate of change of the resulting voltage $U_m$ between the conductor and ground based on the first voltage value $u_1$, and determining if the initial rate of change fulfils a second condition, determining that the electric insulation is sufficient when at least one of the first and second conditions is fulfilled.

13 Claims, 3 Drawing Sheets

ELECTRIC INSULATION MONITORING ARRANGEMENT

TECHNICAL FIELD

The invention relates to a method for determining whether an electric insulation of a conductor in an electric system, such as an electric system that can be described as a resistor-capacitor circuit, is sufficient. The invention further relates to an electronic device for determining whether an electric insulation of a conductor in such an electric system is sufficient, a computer program, a computer readable medium, and a vehicle.

The invention can for example be applied in electrically operated heavy-duty vehicles, such as trucks, buses and construction equipment. Although the invention will be described with respect to a fully electrified bus, the invention is not restricted to this particular vehicle, but may also be used in other vehicles such as trucks, trailers, wheel loaders, excavators, passenger cars, etc. It may also be applied in electric systems of e.g. electrically operated vessels and in various working machines. It is applicable in fully electrically operated vehicles as well as in hybrid vehicles, comprising also a combustion engine. The invention is also applicable in electric systems in other applications, such as in vessels and in stationary industrial machines.

BACKGROUND

Electric insulation monitoring, also referred to as electric isolation monitoring, is important in electrically operated vehicles provided with electric systems in which hazardous voltage levels are used. By monitoring the electric insulation resistance, it is ensured that the vehicle is safe for a driver and passengers, and that it is safe for a technician to for example perform tasks on-board the vehicle, without risking electric shock. An electric insulation monitoring device may be used for this purpose, which is connected between the chassis of the vehicle, functioning as ground, and a conductor of the electric system, for example one of the DC lines in a direct current (DC) electric system. The electric system may herein be described as a resistor-capacitor circuit.

The insulation monitoring device applies a test load or a test signal between the conductor and the chassis, and the voltage response is detected and evaluated by a measuring unit. If the resistance between the conductor and the chassis, i.e. the insulation resistance, drops below a certain level, the insulation monitoring device may be configured to emit an alarm signal and/or to disconnect a power supply of the electric system.

A typical implementation of insulation monitoring needs quite some time, up to 30 seconds, to establish an electric insulation resistance value. This can cause problems at start-up of electrically operated vehicles, since it is desirable to ensure that the conductors of the electric system on-board the vehicle are sufficiently insulated before vehicle take-off. The long measurement time means that the vehicle start-up will be slow, unless vehicle operation without confirmed electrical safety is allowed during the measurement time period. A vehicle start-up time of 30 seconds is normally not acceptable, and hence vehicle operation may despite the safety issues be allowed during the measurement time. In this case, if the insulation resistance measurement reveals that the insulation is insufficient, the vehicle operator will only be alerted once the vehicle is already running.

SUMMARY

A primary objective of the invention is to provide an in at least some aspect improved method and electronic device for determining whether an electric insulation of a conductor in an electric system is sufficient, such as the electric insulation of a conductor in an electric propulsion system of an electrically operated vehicle. Another objective of the invention is to provide such a method and device that reduce the time necessary for establishing that the electric insulation is sufficient to operate the vehicle in a safe manner.

According to a first aspect of the invention, at least the primary objective is achieved. The method for determining whether an electric insulation of a conductor in an electric system is sufficient, such as in an electric system described as a resistor-capacitor circuit, comprises:

switching on or off a resistive load between the conductor and ground, measuring a first voltage value $u_1$ of a resulting voltage $U_m$ between the conductor and ground at a predetermined first point in time $t_1$ after switching on or off the load.

The method further comprises:

determining if the first voltage value $u_1$ fulfils a predetermined first condition, and/or determining an initial rate of change of the resulting voltage $U_m$ between the conductor and ground over time based on the measured first voltage value $u_1$, and determining if the initial rate of change fulfils a predetermined second condition, determining that the electric insulation is sufficient when at least one of the first and second conditions is fulfilled.

When the electric insulation is not determined to be sufficient, the method further comprises:

predicting a voltage response $U_p$ over time between the conductor and ground by using the initial rate of change and assuming a linear response, initiating a continuous measurement of the resulting voltage $U_m$ between the conductor and ground over time, and comparing the measured resulting voltage $U_m$ to the predicted voltage response $U_p$, determining a point in time when a relation between the measured resulting voltage $U_m$ and the predicted voltage response $U_p$ fulfils a predetermined third condition, and therefrom determining a time constant $\tau$ of the electric system and/or predicting a steady-state voltage $u_{ss}$ between the conductor and ground, using the determined time constant $\tau$ and/or the predicted steady-state voltage $u_{ss}$, estimating whether the electric insulation between the conductor and ground is sufficient.

By the proposed method, it is possible to make an initial estimate of whether the electric insultation is sufficient, without having to establish an exact value of the insulation resistance. This enables a fast and reliable determination of whether the electric system is safe to operate or not. The method thus in a reliable manner increases safety of the electric system, without the side effect of a long start-up time. The method offers a three-step approach, in which it is successively checked if the first and second conditions are fulfilled, and if not, a prediction of the time constant $\tau$ and/or the steady-state voltage $u_{ss}$ is/are used to estimate whether the electric insulation resistance is sufficient. The start-up time can thereby be significantly reduced, in particular in the cases in which one of the first and second conditions are fulfilled. In those cases, it will not be necessary to proceed with measuring the resulting voltage $U_m$ until the third condition is fulfilled. Instead, it can immediately be established that the insulation resistance is sufficient.

The electric system may be an electric system that can be described as a resistor-capacitor circuit, i.e. an electric system that comprises resistive and capacitive elements and has a time constant $\tau=RC$, wherein R is the resistance and C is the capacitance of the electric system. The system may be a floating class B direct current (DC) voltage system where stray or other capacitance to ground makes insulation monitoring difficult and potentially slow. An insulated electrical cable or conductor is an example of such a system.

The method described herein is particularly applicable to DC conductors in DC electric systems, but may in principle also be applied in alternating current (AC) electric systems. The conductor may e.g. be a positive or negative conductor of a DC electric system.

Optionally, determining the initial rate of change and determining if the initial rate of change fulfils the predetermined second condition are only carried out when the predetermined first condition is not fulfilled. Thus, if the first condition is fulfilled, the initial estimate can be provided very fast without additional calculations.

Optionally, the steady-state voltage $u_{ss}$ is predicted, and the electric insulation between the conductor and ground is considered sufficient if the predicted steady-state voltage $u_{ss}$ complies with a predetermined steady-state voltage threshold.

Optionally, the steady-state voltage $u_{ss}$ is predicted, and estimating whether the electric insulation between the conductor and ground is sufficient comprises inputting the predicted steady-state voltage $u_{ss}$ to an electric insulation calculation algorithm. Such an electric insulation calculation algorithm may e.g. use the known resistive load $R_{test}$, an initial voltage value $u_0$ as determined prior to switching on or off the load $R_{test}$, and the steady-state voltage $u_{ss}$. Using a simple leakage model, the insulation resistance $R_{leak}$ can be estimated as $R_{leak}=R_{test}*(u_0/u_{ss}-1)$. There exist numerous different algorithms for calculating electric insulation resistance once a value of the time constant $\tau$ and/or the steady-state voltage $u_{ss}$ has been established.

Optionally, an initial voltage value $u_0$ is determined prior to switching on or off the load, wherein the relation between the measured resulting voltage $U_m$ and the predicted voltage response $U_p$ is considered to fulfill the predetermined third condition at a point in time $t_3$ after switching on or off the load when the following equation is fulfilled:

$$(U_m(t_3)-u_0)/(U_p(t_3)-u_0) \leq x_3,$$

wherein $x_3$ is a predetermined threshold value, $U_m(t_3)$ is the resulting voltage value at the time $t_3$ and $U_p(t_3)$ is the predicted voltage response value at the time $t_3$. The initial voltage value $u_0$ may be determined at a point in time selected so that the voltage value at that time corresponds to the voltage value just before switching. It may e.g. be selected as a point in time immediately preceding the switching on or off of the load, or it may be measured or otherwise established at an earlier point in time if the voltage can be assumed to be stable.

Optionally, the predetermined threshold value $x_3$ is set to a value in a range of 0.63 to 0.75, including the end points, such as to 0.75, or to 0.70, or to 0.65, or to 0.63. The predetermined threshold value $x_3$ may also be set so that it is reached at a point in time of $0.7*\tau \leq t_3 \leq \tau$, or $0.8*\tau \leq t_3 \leq \tau$, or $0.9*\tau \leq t_3 \leq \tau$, or when $t_3=\tau$, wherein $\tau$ is the time constant. The predicted voltage response $U_p(\tau)$ may be used as input to an insulation calculation algorithm, by assuming $U_p(\tau)=u_{ss}$. By setting the threshold value $x_3$ to 0.63 or slightly above, such as to a value within the above defined range, a sufficiently reliable prediction of the steady state voltage $u_{ss}$ may be achieved.

Optionally, the predetermined first condition is considered fulfilled when the first voltage value $u_1$ differs from an initial voltage value $u_0$ determined prior to switching on or off the load by at least a predetermined threshold amount $x_1$. A fast voltage response indicates that the insulation resistance is sufficient, and further calculations and estimations are not necessary. The voltage $u_0$ may be determined as described above.

Optionally, the predetermined second condition is considered fulfilled if the initial rate of change exceeds a predetermined threshold rate of change. Here, it is the magnitude of the rate of change which is of interest, regardless of whether the voltage has increased or decreased. A large initial rate of change of the voltage indicates that the insulation resistance is sufficient. In cases where the predetermined first condition is not fulfilled, or not checked, the insulation resistance can therefore still be determined to be sufficient when the second condition is fulfilled.

Optionally, the predetermined first point in time $t_1$, is set to 0.5 second or less, or 0.2 second or less, or 0.1 second or less, after switching on or off the load. It should be ensured that the first voltage value $u_1$ is measured while the voltage response can be assumed to be linear, i.e. within a relatively short time period after switching on or off the load. For practical reasons, the first voltage value $u_1$, may be measured when it is assumed that the voltage change is large enough to be accurately determined, such as after 50-100 milliseconds (ms). This will ensure that an accurate estimation of whether the insulation resistance is sufficient can be achieved.

According to a second aspect of the invention, at least the primary object is achieved by an electronic device for determining whether an electric insulation of a conductor in an electric system is sufficient, such as in an electric system described as a resistor-capacitor circuit, the electronic device comprising a switching device for switching on and off a resistive load between the conductor and ground and a voltage sensor for measuring a voltage between the conductor and ground, and a control unit for controlling the switching device and the voltage sensor, wherein the electronic device is configured to perform the method according to the first aspect.

According to a third aspect of the invention, a vehicle comprising the electronic device according to the second aspect is provided, wherein the electronic device is configured to determine whether the electric insulation of at least one conductor of an electric system within the vehicle is sufficient.

According to a fourth aspect of the invention, a computer program is provided comprising program code means for causing the electronic device according to the second aspect to perform the method according to the first aspect.

According to a fifth aspect of the invention, a computer readable medium is provided carrying the computer program according to the fourth aspect.

Further advantages and advantageous features of the invention are disclosed in the following description and in the dependent claims.

BRIEF DESCRIPTION OF THE DRAWINGS

With reference to the appended drawings, below follows a more detailed description of embodiments of the invention cited as examples.

In the drawings.

The drawings are schematic and not necessarily drawn to scale.

DETAILED DESCRIPTION OF EXAMPLE EMBODIMENTS OF THE INVENTION

In the present detailed description, embodiments of the method according to the present invention are mainly described with reference to an all-electric bus, comprising a propulsion system in the form of battery powered electric motors. However, it should be noted that various embodiments of the described invention are equally applicable for a wide range of hybrid and electric vehicles. The invention is also applicable in electric systems in e.g. construction equipment, vessels, etc.

Figure 1:
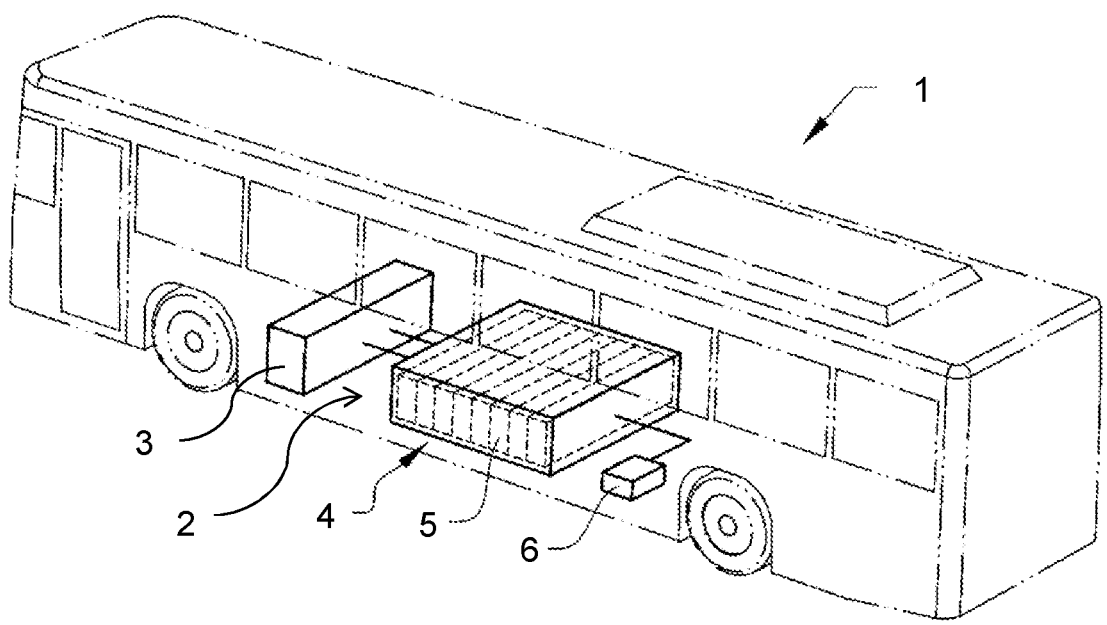
FIG. 1 schematically shows an electrically operated vehicle in which a method according to the invention may be applied, FIG. 2 schematically shows an example embodiment of an electronic device according to the invention.

FIG. 1 shows a simplified perspective view of an all-electric vehicle in the form of a bus 1. The bus 1 comprises an electric system 2, which herein comprises an electric drive unit 3 for propulsion of the bus. Of course, other loads may be provided in addition to or instead of the electric drive unit 3, for example auxiliary systems requiring electric power, and/or an on-board charger, and/or a power take-off. The electric drive unit 3 may comprise a traction motor, power electronics, and controls associated therewith (not shown).

The bus 1 further carries an electric energy storage system (ESS) 4 comprising a plurality of battery modules 5, wherein each battery module 5 may in turn comprise a plurality of battery cells (not shown). The battery cells may be connected in series to provide an output DC voltage having a desired voltage level. Suitably, the battery cells are of lithium-ion type, but other types may also be used. The number of battery cells per battery module 5 may be in the range of 50 to 500 cells. It is to be noted that the ESS 4 may also include a plurality of battery packs, each comprising one or more battery modules 5. An ESS control unit 6 is provided for controlling operation of the ESS 4.

Figure 2:
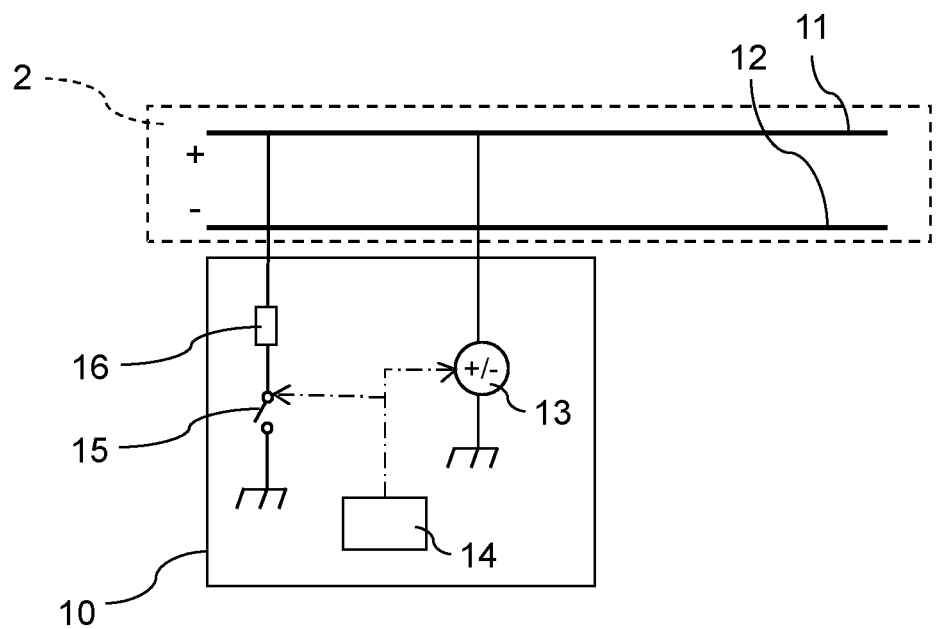

FIG. 2 schematically shows an electric system 2 of a vehicle, such as the electric system 2 of the bus 1 illustrated in FIG. 1. The electric system 2 can be described as a resistor-capacitor (RC) circuit and comprises a first conductor 11, herein illustrated as a positive DC line, and a second conductor 12, herein illustrated as a negative DC line. An electronic device 10 according to an embodiment of the invention is connected to the electric system 2 and configured for determining whether the electric insulation resistance of the electric system 2, i.e. between each one of the conductors 11, 12 and a ground reference, is sufficient. In this case, a chassis of the vehicle 1 serves as the ground reference.

The electronic device 10 comprises a switching device 15 for switching on and off a known resistive load 16 between one of the conductors 11, 12 and ground, and a voltage sensor 13 for measuring a voltage between that conductor 11, 12 and ground. A control unit 14 for controlling the switching device 15 and the voltage sensor 13 is also provided. In the illustrated example, the electronic device 10 is for ease of understanding illustrated with a single switching device 15, and a single voltage sensor 13. Of course, the electronic device may comprise a plurality of switching devices and voltage sensors in order to determine whether the insulation resistance is sufficient for a number of conductors within the electric system 2, such as at least two switching devices, two voltage sensors, etc. The resistive load 16 may or may not form part of the electronic device 10.

Figure 3:
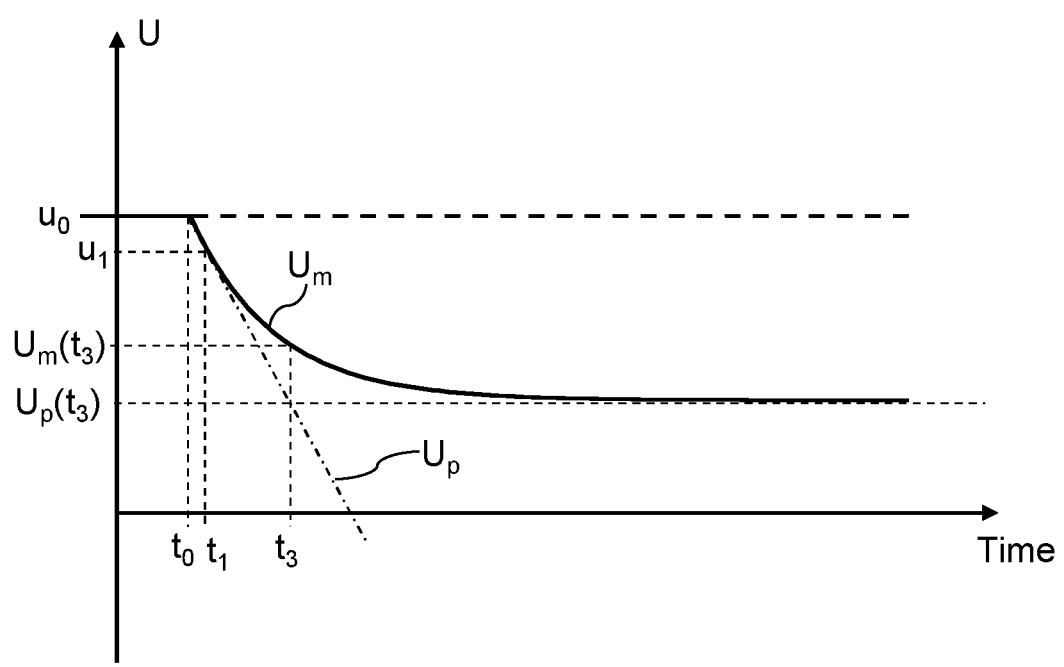
FIG. 3 is a diagram illustrating a voltage measurement.
Figure 4:
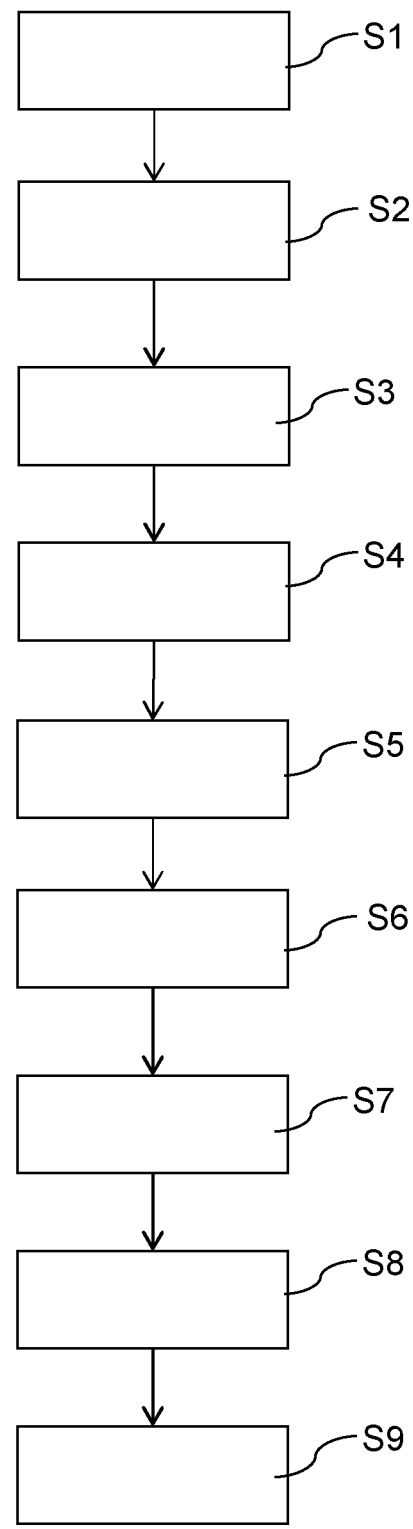
FIG. 4 is a flow-chart illustrating a method according to an embodiment of the invention.

Reference is now made to FIG. 3 and FIG. 4. FIG. 3 illustrates voltage U over time t in an electric system 2 as the test load 16, having a resistance value $R_{test}$, is switched on. FIG. 4 illustrates a method for determining whether the electric insulation, i.e. the electric insulation resistance, of the conductor 11, 12 is sufficient. The method may be performed by the electronic device 10 and comprises the following actions:

S1: Switching on or off the resistive load 16 between the conductor 11, 12 and ground, using the switching device 15. This step is carried out at a point in time $t_0$. Prior to switching on or off the load 16, an initial voltage value $u_0$ may be determined by means of the voltage sensor 13. Upon switching on the load 16, a voltage drop occurs in the illustrated example.

S2: Measuring a first voltage value $u_1$ of a resulting voltage $U_m$ between the conductor 11, 12 and ground at a predetermined first point in time $t_1$ after switching on or off the load. This may be carried out using the voltage sensor 13. The resulting voltage $U_m$ is illustrated by the solid line in FIG. 3. The predetermined first point in time $t_1$, may e.g. be set to 0.5 second or less, or 0.2 second or less, or 0.1 second or less, after switching on or off the load 16. The method further comprises an action S3 and an action S4, of which one of both may be carried out.

S3: determining if the first voltage value $u_1$, fulfils a predetermined first condition. The predetermined first condition may be set so that it is considered fulfilled when the first voltage value $u_1$ differs from an initial voltage value $u_0$ determined prior to switching on or off the load 16 by at least a predetermined threshold amount $x_1$.

S4: determining an initial rate of change k of the resulting voltage $U_m$ between the conductor 11, 12 and ground over time t based on the measured first voltage value $u_1$, and determining if the initial rate of change k fulfils a predetermined second condition. The rate of change k is determined as $k=(u_1-u_0)/(t_1-t_0)$. The predetermined second condition may e.g. be set so that it is considered fulfilled if the magnitude of the initial rate of change exceeds a predetermined threshold magnitude. The action S4 may, if the predetermined first condition is fulfilled, be omitted.

The method further comprises an action S5 of determining that the electric insulation is sufficient when at least one of the first and second conditions is fulfilled. Thus, when it has been determined in step S3 that the first condition is fulfilled, and/or when it has been determined in step S4 that the second condition is fulfilled, the electric insultation is determined to be sufficient.

When the electric insulation cannot be determined to be sufficient after carrying out the actions S1-S5, i.e. when none of the first and second conditions are fulfilled, the method further comprises the following actions:

S6: predicting a voltage response $U_p$ over time between the conductor 11, 12 and ground by using the initial rate of change k and assuming a linear response. In an electric system 2 describable as an RC circuit, the initial voltage response after switching on or off the load 16 can be assumed to be linear. The predicted voltage response $U_p$ is illustrated as a dash-dot line in FIG. 3.

S7: initiating a continuous measurement of the resulting voltage $U_m$ between the conductor 11, 12 and ground over time t, and comparing the measured resulting voltage $U_m$ to the predicted voltage response $U_p$. The resulting voltage $U_m$ may be sampled using the voltage sensor 13 at a predetermined frequency.

S8: determining a point in time $t_3$ when a relation between the measured resulting voltage $U_m$ and the predicted voltage $U_p$ fulfils a predetermined third condition, and therefrom determining a time constant $\tau$ of the electric system 2 and/or predicting a steady-state voltage $u_{ss}$ between the conductor 11, 12 and ground. The relation between the measured resulting voltage $U_m$ and the predicted voltage response $U_p$ may be considered to fulfill the predetermined third condition at a point in time $t_3$ after switching on or off the load 16 when the following equation is fulfilled:

$$(U_m(t_3)-u_0)/(U_p(t_3)-u_0) \leq x_3,$$

wherein $x_3$ is a predetermined threshold value, $U_m(t_3)$ is the resulting voltage value at the time $t_3$ and $U_p(t_3)$ is the predicted voltage response value at the time $t_3$. The ratio describes how much the measured resulting voltage $U_m$ has changed in comparison with the predicted voltage response $U_p$. When the measured resulting voltage $U_m$ has changed 63% compared to the predicted voltage response $U_p$, the time constant $\tau$ of the electric system has been reached. The threshold value $x_3$ may therefore be set to a value in a range of 0.63 to 0.75, including the end points, such as to 0.75, or to 0.70, or to 0.65, or to 0.63. The predetermined threshold value $x_3$ may also be set so that it is reached at a point in time of $0.7*\tau \leq t_3 \leq \tau$, or $0.8*\tau \leq t_3 \leq \tau$, or $0.9*\tau \leq t_3 \leq \tau$, or when $t_3=\tau$.

S9: using the determined time constant $\tau$ and/or the predicted steady-state voltage $u_{ss}$, estimating whether the electric insulation between the conductor 11, 12 and ground is sufficient. The predicted steady-state voltage $u_{ss}$ is a prediction of the asymptotic value of the measured voltage response $U_m$ over time. The estimation may be realized by inputting the predicted steady-state voltage $u_{ss}$ to an electric insulation calculation algorithm, yielding a prediction of the insulation resistance. The electric insulation between the conductor 11, 12 and ground may be deemed to be sufficient if it exceeds a predetermined threshold resistance value. The threshold resistance value may be set with a safety margin so as to take into consideration that the steady-state voltage $u_{ss}$ and/or the time constant $\tau$ is/are predicted prior to reaching an actual steady-state. The electric insulation between the conductor 11, 12 and ground may alternatively be considered sufficient if the predicted steady-state voltage $u_{ss}$ complies with a predetermined steady-state voltage threshold. The steady-state voltage threshold may be set in advance, such as by calculating a steady-state voltage value for a given insulation resistance value.

When the insulation resistance is determined to be insufficient, the method may include taking at least one action in response thereto, such as generating a signal and/or disconnecting a power supply of the electric system 2.

The control unit 14 may include a microprocessor, a microcontroller, a programmable digital signal processor or another programmable device. Thus, the control unit 14 comprises electronic circuits and connections (not shown) as well as processing circuitry (not shown) such that the control unit 14 can communicate with e.g. different parts of the bus 1 or with different control units of the bus 1 and/or of the electric system 2. The control unit 14 may comprise modules in either hardware or software, or partially in hardware or software, and communicate using known transmission buses such a CAN-bus and/or wireless communication capabilities. The processing circuitry may be a general-purpose processor or a specific processor. The control unit 14 comprises a non-transitory memory for storing computer program code and data. Thus, the skilled person realizes that the control unit 14 may be embodied by many different constructions.

It is to be understood that the present invention is not limited to the embodiments described above and illustrated in the drawings; rather, the skilled person will recognize that many changes and modifications may be made within the scope of the appended claims.

The invention claimed is:

1. A method for determining whether an electric insulation of a conductor in an electric system is sufficient, such as in an electric system described as a resistor-capacitor circuit, the method comprising:
   switching on or off a resistive load between the conductor and ground,
   measuring a first voltage value $u_1$ of a resulting voltage $U_m$ between the conductor and ground at a predetermined first point in time $t_1$ after switching on or off the load,
the method further comprising:
   determining if the first voltage value $u_1$ fulfils a predetermined first condition, and/or
   determining an initial rate of change of the resulting voltage $U_m$ between the conductor and ground over time based on the measured first voltage value $u_1$, and determining if the initial rate of change fulfils a predetermined second condition,
   determining that the electric insulation is sufficient when at least one of the first and second conditions is fulfilled,
wherein, when the electric insulation is not determined to be sufficient, the method further comprises:
   predicting a voltage response $U_p$ over time between the conductor and ground by using the initial rate of change and assuming a linear response,
   initiating a continuous measurement of the resulting voltage $U_m$ between the conductor and ground over time, and comparing the measured resulting voltage $U_m$ to the predicted voltage response $U_p$,
   determining a point in time when a relation between the measured resulting voltage $U_m$ and the predicted voltage response $U_p$ fulfils a predetermined third condition, and therefrom determining a time constant $\tau$ of the electric system and/or predicting a steady-state voltage $u_{ss}$ between the conductor and ground,
   using the determined time constant $\tau$ and/or the predicted steady-state voltage $u_{ss}$, estimating whether the electric insulation between the conductor and ground is sufficient.

2. The method according to claim 1, wherein determining the initial rate of change and determining if the initial rate of change fulfils the predetermined second condition are only carried out when the predetermined first condition is not fulfilled.

3. The method according or claim 1, wherein the steady-state voltage $u_{ss}$ is predicted, and wherein the electric insulation between the conductor and ground is considered sufficient if the predicted steady-state voltage $u_{ss}$ complies with a predetermined steady-state voltage threshold.

4. The method according to claim 1, wherein the steady-state voltage $u_{ss}$ is predicted, and wherein estimating whether the electric insulation between the conductor and ground is sufficient comprises inputting the predicted steady-state voltage $u_{ss}$ to an electric insulation calculation algorithm.

5. The method according to claim 1, wherein an initial voltage value $u_0$ is determined prior to switching on or off the load, and wherein the relation between the measured resulting voltage $U_m$ and the predicted voltage response $U_p$ is considered to fulfill the predetermined third condition at a point in time $t_3$ after switching on or off the load when the following equation is fulfilled:

$$(U_m(t_3)-u_0)/(U_p(t_3)-u_0) \leq x_3,$$

wherein $x_3$ is a predetermined threshold value.

6. The method according to claim 5, wherein the predetermined threshold value $x_3$ is set to a value in a range of 0.63 to 0.75, including the end points.

7. The method according to claim 1, wherein the predetermined first condition is considered fulfilled when the first voltage value $u_1$, differs from an initial voltage value $u_0$ determined prior to switching on or off the load by at least a predetermined threshold amount $x_1$.

8. The method according to claim 1, wherein the predetermined second condition is considered fulfilled if the initial rate of change exceeds a predetermined threshold rate of change.

9. The method according to claim 1, wherein the predetermined first point in time $t_1$, is set to 0.5 second or less, or 0.2 second or less, or 0.1 second or less, after switching on or off the load.

10. An electronic device for determining whether an electric insulation of a conductor in an electric system is sufficient, such as in an electric system described as a resistor-capacitor circuit, the electronic device comprising a switching device for switching on and off a resistive load between the conductor and ground and a voltage sensor for measuring a voltage between the conductor and ground, and a control unit for controlling the switching device and the voltage sensor, wherein the electronic device is configured to perform the method according to claim 1.

11. A vehicle comprising the electronic device according to claim 10, wherein the electronic device is configured to determine whether the electric insulation of at least one conductor of an electric system within the vehicle is sufficient.

12. A computer program comprising program code means for causing the electronic device of claim 10 to perform the steps of claim 1.

13. A computer readable medium carrying the computer program according to claim 12.

* * * * *